(12) United States Patent
Hsieh et al.

(10) Patent No.: US 10,438,991 B2
(45) Date of Patent: Oct. 8, 2019

(54) PIXEL LIGHT EMITTING DEVICE

(71) Applicant: Au Optronics Corporation, Hsinchu (TW)

(72) Inventors: I-Hsun Hsieh, Hsinchu (TW); Yang-En Wu, Hsinchu (TW)

(73) Assignee: Au Optronics Corporation, Hsinchu (TW)

(*) Notice: Subject to any disclaimer, the term of this patent is extended or adjusted under 35 U.S.C. 154(b) by 33 days.

(21) Appl. No.: 15/942,581

(22) Filed: Apr. 2, 2018

(65) Prior Publication Data

US 2019/0131341 A1   May 2, 2019

(30) Foreign Application Priority Data

Oct. 31, 2017   (TW) .............................. 106137586 A (51) Int. Cl.
| | | |
|---|---|---|
| H01L 27/15 | (2006.01) | |
| H01L 27/32 | (2006.01) | |
| H01L 33/38 | (2010.01) | |
| H01L 33/08 | (2010.01) | |
| H01L 23/482 | (2006.01) | |

(Continued)

(52) U.S. Cl.
CPC ............ *H01L 27/15* (2013.01); *G02F 1/1503* (2019.01); *G02F 1/1523* (2013.01); *H01L 23/482* (2013.01); *H01L 27/153* (2013.01); *H01L 27/156* (2013.01); *H01L 27/3211* (2013.01); *H01L 33/08* (2013.01); *H01L 33/382* (2013.01); *H01L 33/387* (2013.01); *H01L 33/44* (2013.01); *H01L 33/502* (2013.01); *G02F 2001/164* (2019.01)

(58) Field of Classification Search
CPC ..... H01L 27/15; H01L 27/153; H01L 27/156; H01L 27/3211; H01L 33/08; H01L 33/382; H01L 33/387
USPC ........................................ 257/88, 89, 93, 98
See application file for complete search history.

(56) References Cited

U.S. PATENT DOCUMENTS

| | | |
|---|---|---|
| 7,012,371 B2 | 3/2006 | Wan et al. |
| 7,345,416 B2 | 3/2008 | Erchak |
| | (Continued) | |

FOREIGN PATENT DOCUMENTS

| | | |
|---|---|---|
| CN | 102386319 | 3/2012 |
| CN | 103217832 | 7/2013 |
| | (Continued) | |

*Primary Examiner* — Matthew E Warren
(74) *Attorney, Agent, or Firm* — JCIPRNET (57) ABSTRACT

A pixel light emitting device including a substrate, a plurality of light emitting elements and a shading layer disposed around each of the light emitting elements is provided. Each of the light emitting elements includes a first electrode layer disposed on the substrate, a second electrode layer not contacting with the first electrode layer, a first semiconductor layer disposed on the first electrode layer, a second semiconductor layer disposed on the second electrode layer and covering the first semiconductor layer, a light emitting layer disposed on the second semiconductor layer, a third semiconductor layer disposed on the light emitting layer, and at least one first penetrator, which penetrates the light emitting layer and the second semiconductor layer to form an electrical connection between the first semiconductor layer and the third semiconductor layer.

20 Claims, 5 Drawing Sheets

(51) Int. Cl.
*H01L 33/44* (2010.01)
*H01L 33/50* (2010.01)
*G02F 1/1523* (2019.01)
*G02F 1/1503* (2019.01)
*G02F 1/15* (2019.01)

(56) References Cited

U.S. PATENT DOCUMENTS

| | | | |
|---|---|---|---|
| 8,410,495 B2 | 4/2013 | Hsu et al. | |
| 8,598,614 B2 | 12/2013 | Chen et al. | |
| 8,766,282 B2 | 7/2014 | Noh | |
| 9,048,379 B2 | 6/2015 | Chen et al. | |
| 9,472,725 B2 | 10/2016 | Chen et al. | |
| 9,876,138 B2 | 1/2018 | Chen et al. | |
| 2005/0099122 A1 | 5/2005 | Wan et al. | |
| 2010/0213474 A1* | 8/2010 | Hsu | H01L 27/156 257/89 |
| 2011/0156066 A1* | 6/2011 | Yao | H01L 33/32 257/89 |
| 2012/0049227 A1 | 3/2012 | Chen et al. | |
| 2012/0241724 A1* | 9/2012 | Tsang | H01L 33/025 257/28 |
| 2013/0222731 A1 | 8/2013 | Hsu et al. | |
| 2013/0277696 A1* | 10/2013 | Matsui | H01L 33/382 257/96 |
| 2014/0084324 A1 | 3/2014 | Chen et al. | |
| 2014/0110701 A1 | 4/2014 | Noh | |
| 2014/0131758 A1* | 5/2014 | Shinohara | H01L 33/382 257/99 |
| 2014/0145222 A1* | 5/2014 | Yang | H01L 27/153 257/93 |
| 2015/0153623 A1 | 6/2015 | Shi | |
| 2015/0236208 A1 | 8/2015 | Chen et al. | |
| 2016/0049444 A1 | 2/2016 | Hsu et al. | |
| 2017/0012167 A1 | 1/2017 | Chen et al. | |
| 2017/0018679 A1* | 1/2017 | Lee | H01L 33/06 |
| 2017/0092820 A1* | 3/2017 | Kim | H01L 25/0753 |

FOREIGN PATENT DOCUMENTS

| | | |
|---|---|---|
| CN | 103779380 | 5/2014 |
| TW | 200516630 | 5/2005 |
| TW | I466266 | 12/2014 |

* cited by examiner

PIXEL LIGHT EMITTING DEVICE

CROSS-REFERENCE TO RELATED APPLICATION

This application claims the priority benefit of Taiwan application serial no. 106137586, filed on Oct. 31, 2017. The entirety of the above-mentioned patent application is hereby incorporated by reference herein and made a part of this specification.

BACKGROUND OF THE DISCLOSURE

1. Field of the Disclosure

The disclosure relates to a pixel light emitting device, and particularly relates to a pixel light emitting device using a light emitting diode.

2. Description of Related Art

A light emitting diode (LED) has advantages of long service life, a small size, high shock resistance, low heat production and low power consumption and is therefore widely used for an indicator or light sources in domestic and various appliances.

Non-transparent components such as electrode pads or gold wires are disposed in a light emitting element for widely use in a traditional direct-type light-emitting diode backlight module and therefore tend to cause a reduction in brightness. With miniaturization of the light emitting element, the problem becomes more notable, and because the location where the electrode pad is disposed requires conduction by additionally using the gold wire, the gold wire tends to have the problems of necking and even being broken down.

With miniaturization of the light emitting element, it is hard to catch in a display device manufacturing process because of diminished size and therefore causes the problem of dropping down or missing part.

When an n-type electrode pad and a p-type electrode pad are disposed on the same side of a substrate, a carrier runs in the shortest path in the light emitting device, and therefore, a current crowding effect could happen and lead to uneven and low brightness of emitted light.

SUMMARY OF THE DISCLOSURE

Given the above, a pixel light emitting device is provided and may solve the problems of non-transparent components blocking light and a light emitting element (such as a light emitting diode) dropping down or missing part, and meanwhile, avoid the problem of uneven brightness caused by the current crowding effect.

The pixel light emitting device according to the embodiments of the disclosure includes a substrate, a plurality of light emitting elements and a shading layer disposed around each of the light emitting elements. Each of the light emitting elements includes: a first electrode layer, disposed on the substrate; a second electrode layer, disposed on the substrate, and not contacting the first electrode layer; a first semiconductor layer, disposed on the first electrode layer; a second semiconductor layer, disposed on the second electrode layer and covering the first semiconductor layer; a light emitting layer, disposed on the second semiconductor layer; a third semiconductor layer, disposed on the light emitting layer; and at least one first penetrator, penetrating the light emitting layer and the second semiconductor layer to allow the electrical connection between the first semiconductor layer and the third semiconductor layer.

According to an embodiment of the disclosure, the second electrode layers of each of the light emitting elements are electrically connected to each other.

According to an embodiment of the disclosure, the second electrode layers of each of the light emitting elements are electrically connected to each other in parallel.

According to an embodiment of the disclosure, each of the light emitting elements includes a plurality of first penetrators which arranged in an array on the first electrode layer.

According to an embodiment of the disclosure, an isolating layer is disposed between the first penetrator and any one of the light emitting layer and the second semiconductor layer, and the first penetrator is made from a semiconductor material or conductive material.

According to an embodiment of the disclosure, a shading layer between the two adjacent light emitting elements includes: a third electrode layer, closely adjacent to the one of light emitting elements; a fourth electrode layer, closely adjacent to the another light emitting element; and an electrochromic material layer, disposed between the third electrode layer and the fourth electrode layer.

According to an embodiment of the disclosure, the third electrode layer is electrically isolated from the light emitting element, and the fourth electrode layer is electrically isolated from the another light emitting element.

According to an embodiment of the disclosure, the light emitting element includes: an insulating layer, disposed between the first semiconductor layer and the second semiconductor layer, and the first penetrator penetrates the insulating layer.

According to an embodiment of the disclosure, the light emitting element further includes: a buffer layer, disposed between the second semiconductor layer and the light emitting layer; a fourth semiconductor layer, disposed between the buffer layer and the light emitting layer; and at least one second penetrator, penetrating the buffer layer, so the second semiconductor layer is electrically connected to the fourth semiconductor layer, and the first penetrator penetrates the buffer layer and the fourth semiconductor layer.

According to an embodiment of the disclosure, the first semiconductor layer, the third semiconductor layer and the first penetrator have a first carrier.

According to an embodiment of the disclosure, the second semiconductor layer, the fourth semiconductor layer and the second penetrator have a second carrier, and the first carrier is different from the second carrier.

According to an embodiment of the disclosure, the light emitting elements include a first light emitting element, a second light emitting element and a third light emitting element, emitting different colored light respectively.

According to an embodiment of the disclosure, each of the second electrode layers of the first light emitting element, the second light emitting element and the third light emitting element are electrically connected to each other.

According to an embodiment of the disclosure, each of the second electrode layers of the first light emitting element, the second light emitting element and the third light emitting element are electrically connected to each other, and each of the second electrode layers of each of the light emitting elements are closely adjacent to each other.

According to an embodiment of the disclosure, a first fluorescent material layer is disposed on the first light emitting element, and a second fluorescent material layer is disposed on the second light emitting element. The first fluorescent material layer and the second fluorescent material layer are disposed on the third semiconductor layers respectively.

According to an embodiment of the disclosure, the first light emitting element is configured to emit red light, the second light emitting element is configured to emit green light, and the third light emitting element is configured to emit blue light.

According to an embodiment of the disclosure, the light emitting elements further include a fourth light emitting element.

According to an embodiment of the disclosure, the second electrode layers of the first light emitting element, the second light emitting element, the third light emitting element, and the fourth light emitting element are electrically connected to each other and located at a junction of the first to fourth light emitting elements.

According to an embodiment of the disclosure, a first fluorescent material layer is disposed on the first light emitting element, a second fluorescent material layer is disposed on the second light emitting element, a third fluorescent material layer is disposed on the third light emitting element, and the first fluorescent material layer, the second fluorescent material layer. The third fluorescent material layer are disposed on the third semiconductor layers respectively.

According to an embodiment of the disclosure, the first light emitting element is configured to emit red light, the second light emitting element is configured to emit green light, the third light emitting element is configured to emit white light, and the fourth light emitting element is configured to emit blue light.

In view of the above, the electrode is disposed at the substrate side of the pixel light emitting device according to the embodiments of the disclosure. Thus, non-transparent components such as electrode pads and gold wires connected to the electrode do not block light emitted by the light emitting element, but further increases the efficiency of the light emitting device emitting light.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

The schematic views are only meant to illustrate some embodiments of the disclosure. Thus, the shape, number and proportional size of each of the elements illustrated in the schematic views should not be considered limitations on the disclosure. For instance, the actual number, size and shape of components such as a light emitting device and a shading layer as illustrated in the schematic views are only for the purpose of illustration, and it is not necessary that the actual number, size and shape of the components such as the light emitting device and the shading layer of the disclosure must be shown as in the drawings.

Figure 1A:
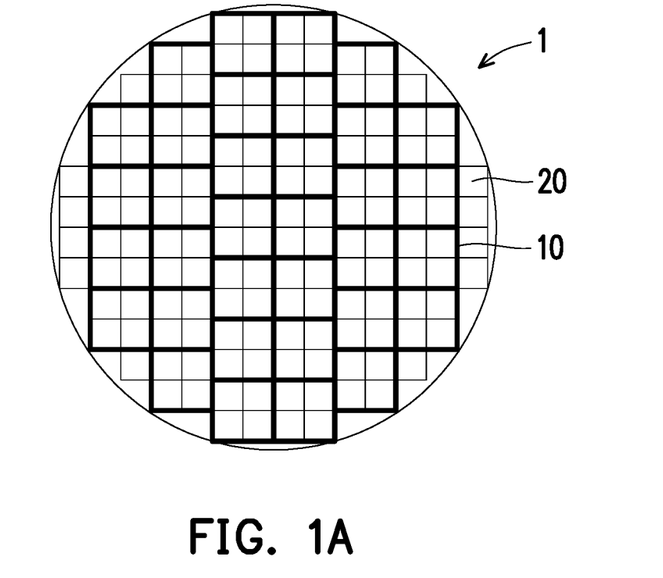
FIG. 1A is a schematic view of a pixel light emitting device according to an embodiment of the disclosure.
Figure 1B:
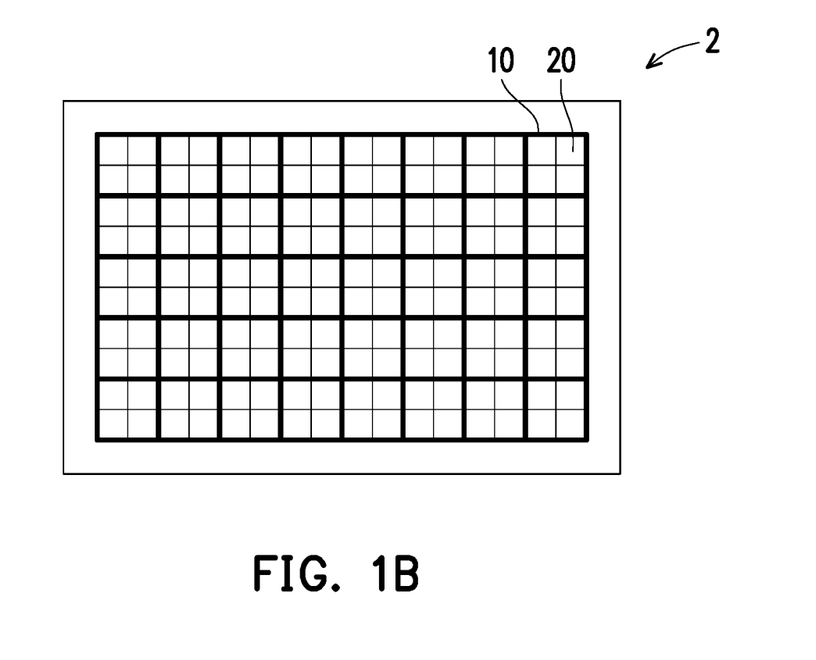
FIG. 1B is a schematic view of a pixel light emitting device according to an embodiment of the disclosure disposed in a display panel.

Due to power conservation, high brightness and suitability to be disposed in a local region, the light emitting diode is widely used in the local dimming technology of a liquid crystal device to increase the comparison of the display device. However, for more preferable displaying effects, the light emitting diode is in the process of miniaturization. The light emitting diode, when miniaturized, may be further used for the display pixel of the display device, but it is hard to catch due to the diminished size in the manufacturing process and tends to drop down to effect the yield rate. In order to solve the problem, FIG. 1A is a schematic view of a pixel light emitting device according to the disclosure. As illustrated in FIG. 1A, a plurality of pixel light emitting devices 10 are disposed on a carrier substrate 1 at the same time. In the embodiment, each of the light emitting devices 10 includes a plurality of light emitting elements 20. For example, four light emitting elements 20 are used in the embodiment. The four light emitting elements 20 adjoin each other and are arranged in an array. The light emitting element 20 may be, but not limited to, a light emitting diode, and may also be other suitable self-emitting devices. FIG. 1B is a schematic view of a pixel light emitting device according to an embodiment of the disclosure disposed in a display panel. As shown in FIG. 1B, each of the pixel light emitting devices 10 includes the four light emitting elements 20 adjoining each other and arranged in an array. Thus, the pixel light emitting device 10 may be viewed as a unit and four light emitting elements 20 thereof can be moved from the carrier substrate 1 simultaneously if the pixel light emitting device 10 is to be moved from the carrier substrate 1 to a display panel 2. Since each of the pixel light emitting devices 10 includes the four light emitting elements 20, the pixel light emitting device 10 has an area bigger than that of the single light emitting element 20. Thus, the pixel light emitting device 10 does not tend to drop down when being moved.

Figure 2A:
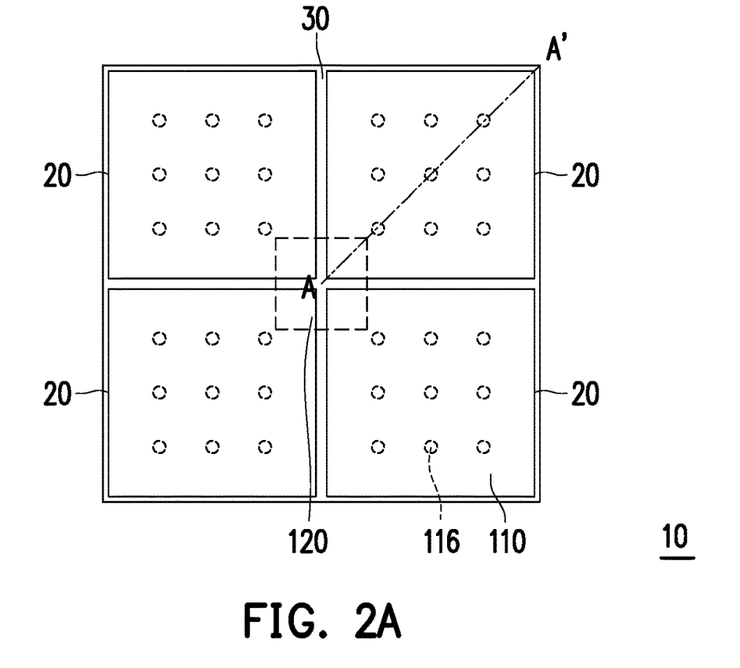
FIG. 2A is a top view of an embodiment of a pixel light emitting device of the disclosure.
Figure 2B:
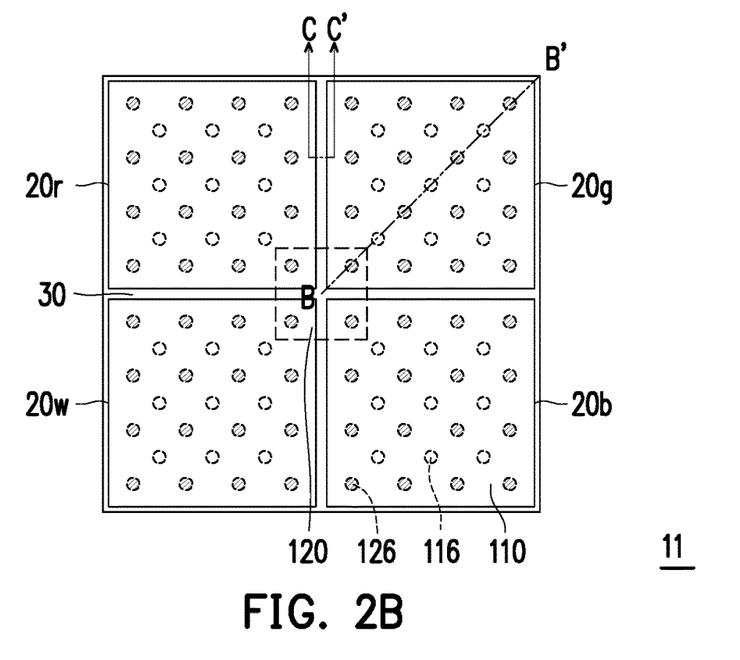
FIG. 2B is a top view of an embodiment of a pixel light emitting device of the disclosure.

FIGS. 2A and 2B are top views of embodiments of the pixel light emitting device of the disclosure. The so-called "top view" means a drawing painted by observing the pixel light emitting device of the disclosure from the above of the substrate, and for the purposes of clear indication and easy clarification, illustration of some elements is omitted.

The pixel light emitting device of the disclosure includes a plurality of light emitting elements and a shading layer that is disposed around each of the light emitting elements. Referring to FIG. 2A, the pixel light emitting device 10 includes the four light emitting elements 20 adjoining each other and arranged in an array and a shading layer 30. At least a portion of the shading layer 30 is disposed around each of the light emitting elements. Below are specific descriptions about the specific structure of the light emitting element 20 in the pixel light emitting device of the disclosure.

Figure 3A:
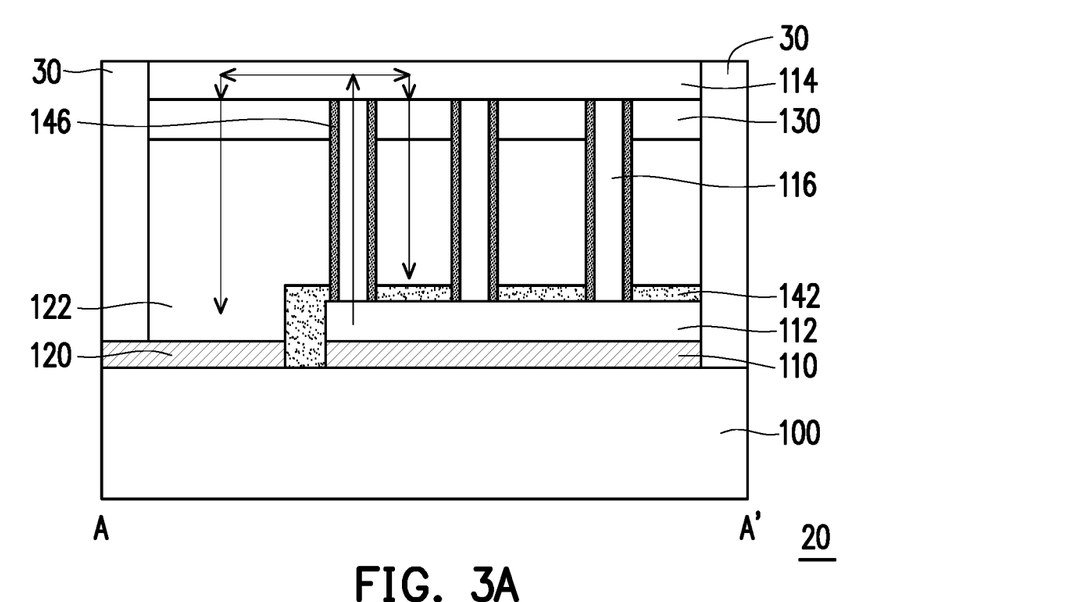
FIG. 3A is a cross-sectional view of the pixel light emitting device taken along line A-A' of FIG. 2A.

FIG. 3A is a cross-sectional view of the pixel light emitting device taken along line A-A' of FIG. 2A. The light emitting element 20 includes a first electrode layer 110, a second electrode layer 120, a first semiconductor layer 112, a second semiconductor layer 122, a light emitting layer 130, a third semiconductor layer 114 and at least one first penetrator 116 that are disposed on a substrate 100.

The material of substrate 100 may be a glass substrate, a sapphire substrate, a semiconductor wafer, a metal substrate, or a resin substrate. An active element may be also predisposed on the substrate 100 before the disposal of the pixel light emitting device 10. The active element may include, but not be limited to, a thin film transistor.

The first electrode layer 110 is disposed on the substrate 100. The second electrode layer 120 is disposed on the substrate 100, and does not contact the first electrode layer 110. No specific limitations are imposed on the materials of the first electrode layer 110 and the second electrode layer 120. For instance, the materials may include a metal or indium tin oxide (ITO).

For the pixel light emitting device 10 according to the embodiments of the disclosure, the second electrode layers 120 of each of the light emitting elements 20 are electrically connected to each other, specifically in parallel. The so-called "electrical connection" may be achieved by disposing the second electrode layers on the same side of each of the light emitting elements or at the corners of the light emitting elements closest to each other and connecting the second electrode layers with the same electrode pad (not shown). In the embodiment, the second electrode layers 120 are disposed in a junction of the light emitting elements. For example, referring to FIG. 2A, the second electrode layers 120 are disposed at the corners of the four light emitting elements 20 respectively with the corners adjoining each other, so the second electrode layers 120 are formed at the center of the pixel light emitting device 10. However, the disclosure is not limited to the above embodiment. More specific explanations are described below.

The first semiconductor layer 112 is disposed on the first electrode layer 110 and has a first carrier. The second semiconductor layer 122 is disposed on the second electrode layer 120 and covers the first semiconductor layer 112, and has a second carrier that is different from the first carrier. An insulating layer 142 is disposed between the first semiconductor layer 112 and the second semiconductor layer 122. In the embodiment, the first semiconductor layer 112 is, for example, a p-type semiconductor layer so that the first carrier is a hole, while the second semiconductor layer 122 is, for instance, an n-type semiconductor layer so that the second carrier is an electron, but the disclosure is not limited to the situation. The first semiconductor layer 112 may be, for instance, an n-type semiconductor layer so that the first carrier is an electron, while the second semiconductor layer 122 is, for instance, a p-type semiconductor layer so that the second carrier is a hole.

The light emitting layer 130 is disposed on the second semiconductor layer 122 and may have a structure of multiple quantum well (MQW). The structure of multiple quantum well is made by disposing a plurality of quantum well layers and quantum barrier layers in an alternating and repeated manner. Further, the light emitting layer 130 may be made from multiple layers of indium gallium nitride and gallium nitride (n-In$_x$Ga$_y$N/GaN) that are stacked alternately. By setting up a proportion of indium or gallium in the light emitting layer 130, the light emitting layer 130 may emit light with different wavelength ranges. In one embodiment, the light emitting layer 130 emits, for instance, blue light.

The third semiconductor layer 114 is disposed on the light emitting layer 130 and has the first carrier. In the embodiment, the third semiconductor layer 114 is, for instance, the p-type semiconductor layer, but the disclosure is not limited to the situation as long as the third semiconductor layer 114 has the same carrier as that of the first semiconductor layer 112.

The first penetrator 116 penetrates the light emitting layer 130, the second semiconductor layer 122 and the insulating layer 142, so the first semiconductor layer 112 is electrically connected to the third semiconductor layer 114. In the embodiment, the first penetrator 116 has the first carrier and is, for instance, the p-type semiconductor layer, but the disclosure is not limited to the situation as long as the first penetrator 116 has the same carrier as that of the first semiconductor layer 112 and the third semiconductor layer 114.

Alternatively, the first penetrator 116 may also be made from other conductive materials as long as the first semiconductor layer 112 is electrically connected to the third semiconductor layer 114. An isolating layer 146 is further provided between the first penetrator 116 and any one of the light emitting layer 130 and the second semiconductor layer 122. The isolating layer 146 disposed around the first penetrator 116 may be made from, for instance, an undoped gallium nitride layer, silicon nitride layer and/or silicon dioxide layer.

In one embodiment, the first penetrators 116 of the light emitting element may be provided. Moreover, as can be shown in FIG. 2A, the first penetrator 116 is arranged in an array on the first electrode layer 110. With the first penetrator 116, the flowing path of the carrier can be changed to further reduce the current crowding effect.

Referring to FIG. 2B, a pixel light emitting device 11 includes a red light emitting element 20r, a blue light emitting element 20b, a green light emitting element 20g, a white light emitting element 20w and the shading layer 30. At least a portion of the shading layer 30 is disposed around at least one of the red light emitting element 20r, the blue light emitting element 20b, the green light emitting element 20g, the white light emitting element 20w. For example, at least a portion of the shading layer 30 is disposed around each of the red light emitting element 20r, the blue light emitting element 20b, the green light emitting element 20g, the white light emitting element 20w.

Figure 3B:
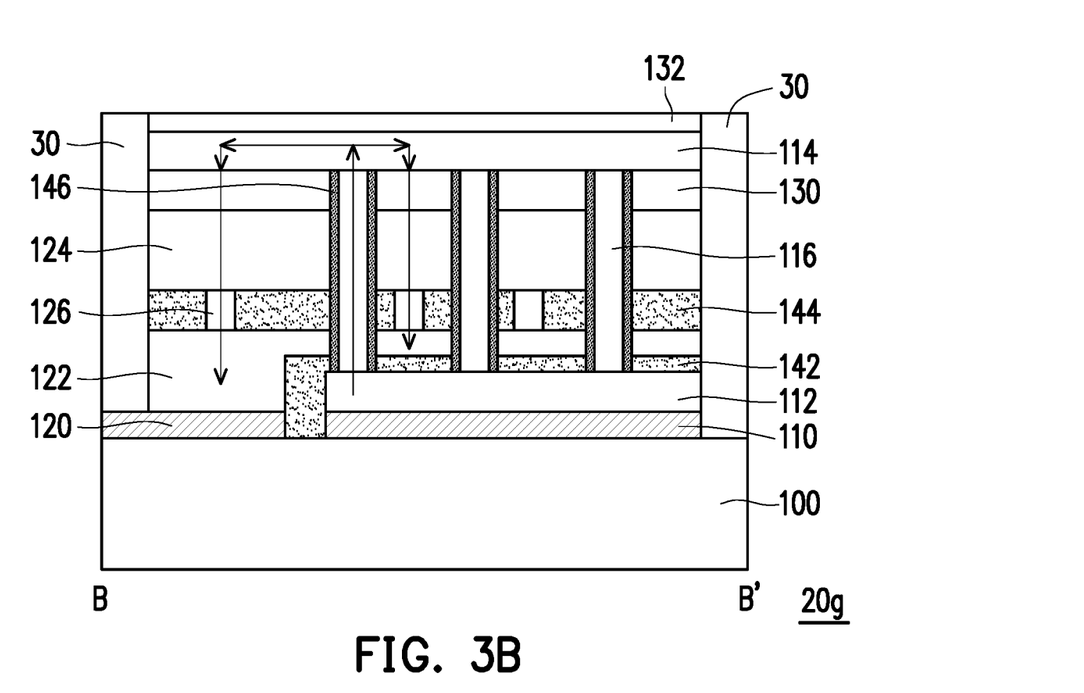
FIG. 3B is a cross-sectional view of the pixel light emitting device taken along line B-B' of FIG. 2B.

FIG. 3B is a cross-sectional view of another pixel light emitting device taken along line B-B' of FIG. 2B. The light emitting element 20 (take the green light emitting element 20g for example) includes the first electrode layer 110, the second electrode layer 120, the first semiconductor layer 112, the second semiconductor layer 122, the light emitting layer 130, the third semiconductor layer 114 and the at least one penetrator 116. In the embodiment, the light emitting element further includes the insulating layer 142, the isolating layer 146, a fourth semiconductor layer 124, a buffer layer 144, at least one second penetrator 126 and a fluorescent material layer 132.

The insulating layer 142 is provided between the first semiconductor layer 112 and the second semiconductor layer 122. In one embodiment, the insulating layer 142 is formed with a method of chemical vapor deposition (PECVD). The insulating layer 142 includes, for instance, the undoped gallium nitride layer, the silicon nitride layer and/or the silicon dioxide layer.

The difference from the previous embodiment is that in this embodiment, the buffer layer 144, the fourth semiconductor layer 124 and the second penetrator 126 may be further disposed between the second semiconductor layer 122 and the light emitting layer 130. At this moment, the first penetrator 116 further penetrates the buffer layer 144 and the fourth semiconductor layer 124. With such configuration, the flowing path of the carrier may be further changed to reduce the current crowding effect.

The buffer layer 144 is disposed between the second semiconductor layer 122 and the light emitting layer 130. The buffer layer 144 may include a dielectric material or an insulating material that is the same as the material of the insulating layer 142.

The fourth semiconductor layer 124 is disposed between the buffer layer 144 and the light emitting layer 130, and has the second carrier that is different from the first earner. In the embodiment, the fourth semiconductor layer 124 may be, for instance, the n-type semiconductor layer, but the disclosure is not limited to the situation as long as the fourth semiconductor layer 124 has the same carrier as the second semiconductor layer 122.

The second penetrator 126 penetrates the buffer layer 144 to allow the electrical connection between the second semiconductor layer 122 and the fourth semiconductor layer 124. In the embodiment, the second penetrator 126 has the second carrier and is, for instance, the n-type semiconductor layer, but the disclosure is not limited the situation as long as the second penetrator 126 has the same carrier as the second semiconductor layer 122 and the fourth semiconductor layer 124. Alternatively, the second penetrator 126 may also be made from other conductive materials as long as the second semiconductor layer 122 is electrically connected to the fourth semiconductor layer 124.

In one embodiment, similar to the first penetrator 116, the second penetrators 126 of the light emitting element may be provided and separated from the first penetrator 116. Moreover, as shown in FIG. 2B, the second penetrator 126 may be arranged in an array in the light emitting element and disposed together with the first penetrator 116 in an alternating manner. With the second penetrator 126, the flowing path of the carrier can be further changed to reduce the current crowding effect.

In FIG. 3B for example, for the green light emitting element 20g, the first carrier flows from the first semiconductor layer 112, passes through the first penetrator 116 and the third semiconductor layer 114 and meets the second carrier in the light emitting layer 130. On the other hand, the second carrier flows from the second semiconductor layer 122, passes through the second penetrator 126 and the fourth semiconductor layer 124 and meets the first carrier in the light emitting layer 130. Arrows shown in FIG. 3B denote flowing directions of some carriers in the green light emitting element 20g, but the carriers of the green light emitting element 20g do not only flow in that area.

In order to change a wavelength of light emitted by the light emitting element, the fluorescent material layer 132 may be further provided on the third semiconductor layer 114. In the embodiment of the disclosure, the light emitted by the light emitting element is blue light having a shorter wavelength. However, with the fluorescent material layer 132, the blue light emitted by the light emitting element is changed into green, yellow or red light having a longer wavelength. Alternatively, two or more fluorescent materials may be mixed together to produce needed colored light (such as white light). Thus, it is not necessary to change the components of the light emitting layer 130 based on the desired wavelength, and it is easier to create a pixel light emitting device capable of emitting various colored light.

Fluorescent materials contained in the fluorescent material layer 132 may be appropriated used based on demand, such as silicates like $M_2SiO_4$:Eu (M=Ca, Sr, Ba, Mg), silicon (oxy)nitrides like β-SiAlON:E, $La_3Si_6N_{11}$:Ce, (Ca, Sr)AlSiN$_3$:Eu (i.e. CASN) or $M_2Si_5N_8$:Eu (M+Ca, Sr, Ba), sulphides like $MGa_2S_4$:Eu (M=Ca, Sr, Ba) or CaS:Eu, quantum dots (QD) like CdSe/ZnSe or garnets like $(Lu,Y)_3Al_5O_{12}$:Ce (i.e. LuAG), $Y_3Al_5O_{12}$:Ce (i.e. YAG) or $Tb_3Al_5O_{12}$:Ce (i.e. TAG). Different colored light can be obtained by combining different fluorescent materials.

As mentioned in one of the embodiments, the shading layer 30 is disposed around each of the light emitting elements. At least a portion of the shading layer 30 is disposed between the adjacent light emitting elements. As shown in FIG. 3A, the shading layer 30 is disposed around the whole light emitting element 20 and covers a whole sidewall of the light emitting element 20. However, the shading layer 30 may also be disposed around the light emitting element 20 by merely covering part of the sidewall of the light emitting element 20.

Not only an ordinary black matrix but also an electrochromic material may be used for the shading layer 30. The electrochromic material is transparent when an electric potential difference is not applied, however, the electrochromic material becomes colored when an electric potential difference is applied. Thus, the electrochromic material may be used as a material of the shading layer. As shown by one of the embodiments of FIGS. 2B and 3B, when mixing together the color of light of the light emitting element in the pixel light emitting device 11 is required, the electrochromic material could be transparent, while mixing together the color of light of the light emitting element in the pixel light emitting device 11 is not required, the electrochromic material could be non-transparent to improve display effect of the display device. Below are embodiments stating specifically how to use the electrochromic material for the shading layer.

Figure 4:
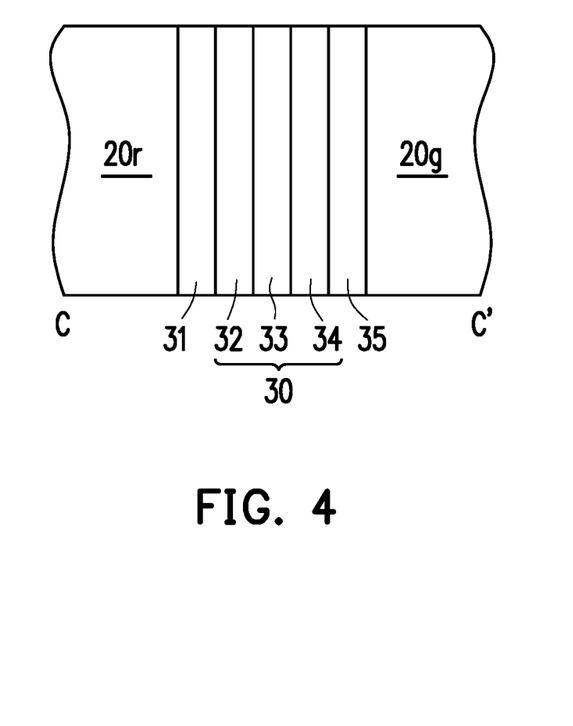
FIG. 4 is a cross-sectional view of the pixel light emitting device taken along line C-C' of FIG. 2B.

FIG. 4 is a cross-sectional view of the pixel light emitting device taken along line C-C' of FIG. 2B. The shading layer 30 includes a third electrode layer 32, a fourth electrode layer 34 and an electrochromic material layer 33 provided between the third electrode layer 32 and the fourth electrode layer 34.

The third electrode layer 32 and the fourth electrode layer 34 are closely adjacent to the light emitting elements (i.e. the red light emitting element 20r and the green light emitting element 20g as shown in FIG. 4) respectively. In one embodiment, the third electrode layer 32 and the four electrode layer 34 are electrically isolated from the adjacent light emitting elements respectively by blocking layers 31 and 35. No specific limitations are imposed on the materials of the third electrode layer 32 and the four electrode layer 34. The materials may include, for instance, a metal or indium tin oxide (ITO).

Only one or more layers of the electrochromic material layers 33 may be provided. In one embodiment, the electrochromic material layer includes an electrochromic layer, an ion conductive layer and an ion storage layer.

The electrochromic material used for the electrochromic material layer 33 may be appropriated used based on demand, such as $WO_3$, polyaniline or/and viologen so that the shading layer 30 may be dark blue, black or dark purple to obtain light shielding purpose.

For the pixel light emitting device 10 according to the embodiments of the disclosure, no specific limitations are imposed on the configuration, size and number of the light emitting element. As can be shown by the embodiment of FIG. 2A, all the light emitting elements 20 emit the same colored light that serves as backlight sources of the display element. At this moment, the fluorescent material layer 132 is needless. Also, as can be shown by the embodiment of FIG. 2B, with the fluorescent material layer 132, the pixel light emitting device 10 includes four light emitting elements emitting different colored light.

Figure 5:
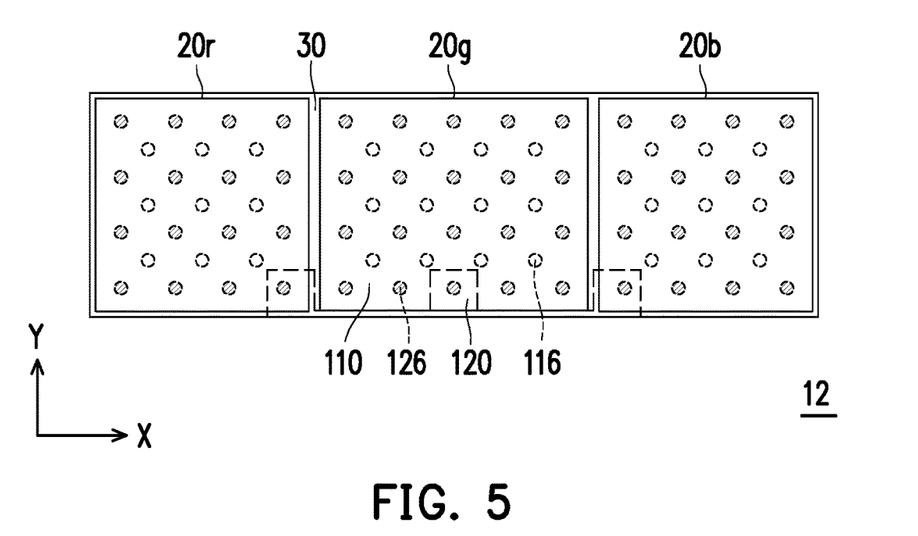
FIG. 5 is a top view of a modification of a pixel light emitting device according to an embodiment of the disclosure.

Alternatively, as can be shown by the modification of FIG. 5, a pixel light emitting device 12 includes three light emitting elements (the red light emitting element 20r, the blue light emitting element 20b and the green light emitting element 20g) with three light emitting elements disposed in an X direction and one light emitting element disposed in a Y direction. Moreover, in the modification of FIG. 5, at least one of the second electrode layers 120 is not located at the corner of its corresponding light emitting element. For example, the second electrode layer 120 of the green light emitting element 20g is not located at the corner of the green light emitting element 20g. Each of the second electrode layers 120 may be partially linked to each other to form the electrical connection.

Figure 6:
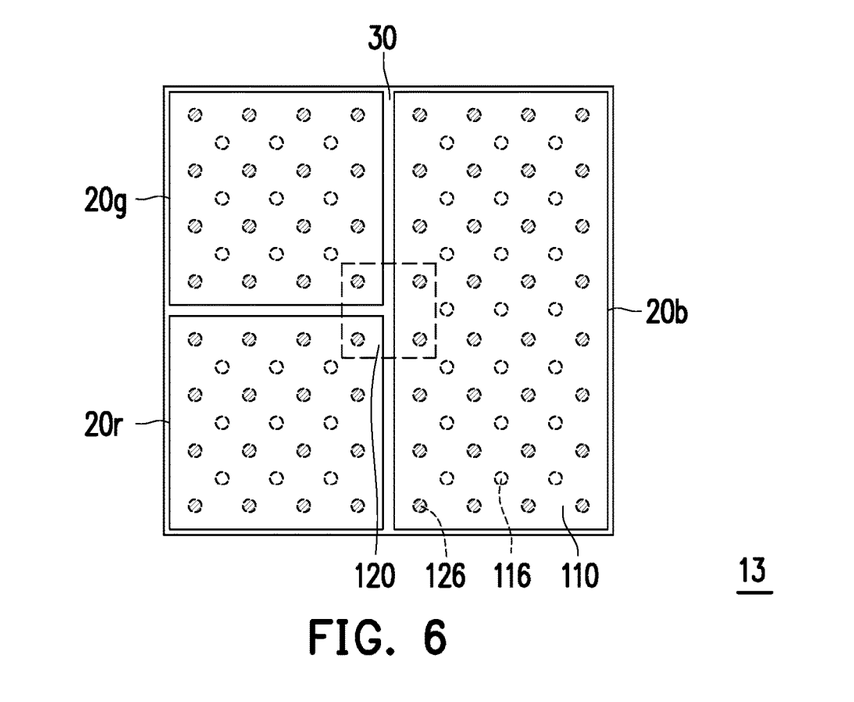
FIG. 6 is a top view of a modification of a pixel light emitting device according to an embodiment of the disclosure.

Alternatively, as can be shown by the modification of FIG. 6, a pixel light emitting device 13 includes three light emitting elements (the red light emitting element 20r, the blue light emitting element 20b and the green light emitting element 20g). An area of the blue light emitting element 20b is approximately twice the area of the red light emitting element 20r and the area of the green light emitting element 20g. In the modification of FIG. 6, the second electrode layers 120 are disposed in a junction of the light emitting elements.

In view of the foregoing, the electrode is disposed at the substrate side of the pixel light emitting device according to the embodiments of the disclosure. Thus, non-transparent components such as electrode pads and gold wires connected to the electrode do not block the light emitted by the light emitting element. Moreover, with disposal of the first penetrator, the flowing path of the carrier can be further changed to reduce the current crowding effect and increase the efficiency of the light emitting device emitting light. Such configuration may further address the problem of the pixel light emitting device dropping down when the pixel light emitting device is disposed in the display device.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A pixel light emitting device, comprising:
   a substrate;
   a plurality of light emitting elements disposed on the substrate, wherein each of the light emitting elements comprises:
      a first electrode layer disposed on the substrate;
      a second electrode layer disposed on the substrate, and not contacting the first electrode layer;
      a first semiconductor layer disposed on the first electrode layer;
      a second semiconductor layer disposed on the second electrode layer and the first semiconductor layer;
      a light emitting layer disposed on the second semiconductor layer;
      a third semiconductor layer disposed on the light emitting layer; and
      at least one first penetrator, penetrating the light emitting layer and the second semiconductor layer such that the first semiconductor layer is electrically connected to the third semiconductor layer; and
   a shading layer, wherein at least a portion of the shading layer is disposed around at least one of the light emitting elements.

2. The pixel light emitting device according to claim 1, wherein the second electrode layers are electrically connected to each other.

3. The pixel light emitting device according to claim 1, wherein the second electrode layers are electrically connected to each other in parallel.

4. The pixel light emitting device according to claim 1, wherein a number of the at least one first penetrator of each of the light emitting elements is plural and the first penetrators of each of the light emitting elements are arranged in an array on the first electrode layer.

5. The pixel light emitting device according to claim 1, wherein an isolating layer is located between the first penetrator and any one of the light emitting layer and the second semiconductor layer, and the first penetrator is made from a semiconductor material or conductive material.

6. The pixel light emitting device according to claim 1, wherein the shading layer between the two adjacent light emitting elements comprises:
   a third electrode layer, closely adjacent to the one of light emitting elements;
   a fourth electrode layer, closely adjacent to the another light emitting element; and
   an electrochromic material layer, disposed between the third electrode layer and the fourth electrode layer, wherein a material of the electrochromic material layer comprises at least one of $WO_3$, polyaniline and viologen.

7. The pixel light emitting device according to claim 6, wherein the third electrode layer is electrically isolated from the light emitting element, and the fourth electrode layer is electrically isolated from the another light emitting element.

8. The pixel light emitting device according to claim 1, wherein the light emitting element further comprises:
   an insulating layer, disposed between the first semiconductor layer and the second semiconductor layer, wherein the first penetrator penetrates the insulating layer.

9. The pixel light emitting device according to claim 1, wherein the light emitting element further comprises:
   a buffer layer, disposed between the second semiconductor layer and the light emitting layer;
   a fourth semiconductor layer, disposed between the buffer layer and the light emitting layer, wherein the first penetrator penetrates the buffer layer and the fourth semiconductor layer; and
   at least one second penetrator, penetrating the buffer layer, such that the second semiconductor layer is electrically connected to the fourth semiconductor layer.

10. The pixel light emitting device according to claim 9, wherein the first semiconductor layer, the third semiconductor layer and the first penetrator have a first carrier.

11. The pixel light emitting device according to claim 10, wherein the second semiconductor layer, the fourth semiconductor layer and the second penetrator have a second carrier, and the first carrier is different from the second carrier.

12. The pixel light emitting device according to claim 1, wherein the light emitting elements comprise a first light emitting element, a second light emitting element and a third light emitting element emitting different colored light respectively.

13. The pixel light emitting device according to claim 12, wherein each of the second electrode layers of the first light emitting element, the second light emitting element and the third light emitting element are electrically connected to each other and located on a same side of the substrate.

14. The pixel light emitting device according to claim 12, wherein the second electrode layers of the first light emitting element, the second light emitting element and the third light emitting element are electrically connected to each other and closely adjacent to each other.

15. The pixel light emitting device according to claim 12, wherein first light emitting element further comprises a first fluorescent material layer disposed on the third semiconductor layer of the first light emitting element, and wherein the second light emitting element further comprises a second fluorescent material layer disposed on the third semiconductor layer of the second light emitting element.

16. The pixel light emitting device according to claim 15, wherein the first light emitting element is configured to emit red light, the second light emitting element is configured to emit green light, and the third light emitting element is configured to emit blue light.

17. The pixel light emitting device according to claim 12, wherein the light emitting elements further comprise a fourth light emitting element.

18. The pixel light emitting device according to claim 17, wherein the second electrode layers of the first light emitting element, the second light emitting element, the third light emitting element and the fourth light emitting element are electrically connected to each other and located at a junction of the first light emitting element, the second light emitting element, the third light emitting element and the fourth light emitting element.

19. The pixel light emitting device according to claim 17, wherein first light emitting element further comprises a first fluorescent material layer disposed on the third semiconductor layer of the first light emitting element, wherein the second light emitting element further comprises a second fluorescent material layer disposed on the third semiconductor layer of the second light emitting element, and wherein the third light emitting element further comprises a third fluorescent material layer disposed on the third semiconductor layer of the third light emitting element.

20. The pixel light emitting device according to claim 19, wherein the first light emitting element is configured to emit red light, the second light emitting element is configured to emit green light, the third light emitting element is configured to emit white light, and the fourth light emitting element is configured to emit blue light.

* * * * *